US012666945B2

(12) United States Patent
Chen et al.

(10) Patent No.: US 12,666,945 B2
(45) Date of Patent: Jun. 23, 2026

(54) INTEGRATION OF VIA AND BOTTOM ELECTRODE FOR MEMORY CELL

(71) Applicant: Taiwan Semiconductor Manufacturing Company, Ltd., Hsinchu (TW)

(72) Inventors: Tzu-Yu Chen, Kaohsiung City (TW); Wen-Ting Chu, Kaohsiung City (TW); Kuo-Chi Tu, Hsin-Chu (TW); Sheng-Hung Shih, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 416 days.

(21) Appl. No.: 18/316,429

(22) Filed: May 12, 2023

(65) Prior Publication Data

US 2024/0379533 A1     Nov. 14, 2024

(51) Int. Cl.
| | |
|---|---|
| *H10W 20/42* | (2026.01) |
| *H10B 51/30* | (2023.01) |

(Continued)

(52) U.S. Cl.
CPC ............ *H10W 20/42* (2026.01); *H10B 51/30* (2023.02); *H10W 20/033* (2026.01);

(Continued)

(58) Field of Classification Search
CPC ......... H01L 21/76883; H01L 21/02164; H01L 21/76816; H01L 21/7684; H01L 21/76843; H01L 21/76846; H01L 21/76864; H01L 21/76877; H01L 23/5283; H01L 23/53228; H01L 23/53238; H01L 21/288; H01L 21/76807–76813; H01L 2221/1015–1036; H01L 21/768–76898; H01L 23/522–53295; H01L 2221/10–1094; H01L 23/535;

(Continued)

(56) References Cited

U.S. PATENT DOCUMENTS

| | | |
|---|---|---|
| 11,195,840 B2 | 12/2021 | Chen et al. |
| 2018/0097173 A1 | 4/2018 | Chuang et al. |

(Continued)

FOREIGN PATENT DOCUMENTS

| | | |
|---|---|---|
| TW | 202318646 A | 5/2023 |

*Primary Examiner* — Moin M Rahman
(74) *Attorney, Agent, or Firm* — Eschweiler & Potashnik, LLC

(57) ABSTRACT

Some embodiments relate to a method of forming an integrated chip, including forming a first wire level over a substrate; depositing an etch stop layer over the first wire level; etching the etch stop layer to form an opening over the first wire level; depositing a barrier layer over the etch stop layer, the barrier layer extending into the opening; depositing a first conductive layer over the barrier layer and in the opening; performing a planarization into the first conductive layer to flatten a top of the first conductive layer, wherein the planarization stops before reaching the barrier layer; depositing a data storage layer and a second conductive layer over the first conductive layer; and patterning the barrier layer, the first conductive layer, the data storage layer, and the second conductive layer to form a memory cell at the opening.

20 Claims, 15 Drawing Sheets

(51) Int. Cl.
  H10W 20/00 (2026.01)
  H10W 20/41 (2026.01)
(52) U.S. Cl.
  CPC ....... H10W 20/062 (2026.01); H10W 20/075 (2026.01); H10W 20/081 (2026.01); H10W 20/435 (2026.01)
(58) Field of Classification Search
  CPC ......... H01L 23/53209; H01L 21/76895; H01L 21/76805; H01L 23/53257; H01L 23/53266; H01L 21/76849; H01L 21/7685; H01L 23/5226; H01L 21/76802; H01L 21/76832; H10B 61/00–22; H10B 51/30; H10B 53/30; H10B 20/00–10; H10B 20/27–50; H10B 51/00–50; H10B 53/00–50; H10B 10/00–18; H10B 12/00–50; H10B 69/00; H10N 50/80; H10N 50/85; H10N 50/01; H10N 50/10; H10D 48/40; H10D 64/689; H10D 30/0415; H10D 30/701; G11C 11/14–1697; G11C 11/5607; G11C 14/0036; G11C 14/0081; G11C 19/02–10; G11C 19/14; G11C 2211/5615–5616; G11C 11/161; G11C 17/10–126; G11C 11/22–2297; G11C 11/5657; G11C 14/0027; G11C 14/0072; G11C 5/02–05; G11C 11/41–419; G11C 11/401–4099; G11C 14/0009–0045; G11C 2211/4016; G11C 16/02; H01F 41/303; H01F 10/324–3295; G01R 33/098; G11B 5/3909
  See application file for complete search history.

(56) References Cited

U.S. PATENT DOCUMENTS

| | | | |
|---|---|---|---|
| 2020/0075855 A1* | 3/2020 | Tseng | H10N 70/8836 |
| 2020/0075857 A1* | 3/2020 | Chou | H10N 70/8833 |
| 2020/0105772 A1 | 4/2020 | Chen et al. | |
| 2020/0106011 A1 | 4/2020 | Chen et al. | |
| 2022/0384464 A1 | 12/2022 | Chen et al. | |

* cited by examiner

1300

122
1181
1161
1141
112
110
106
108
102
104

I                    II

1400

1402

122
1181
1161
1141
112
110
106
108
102
104

I                    II

2400

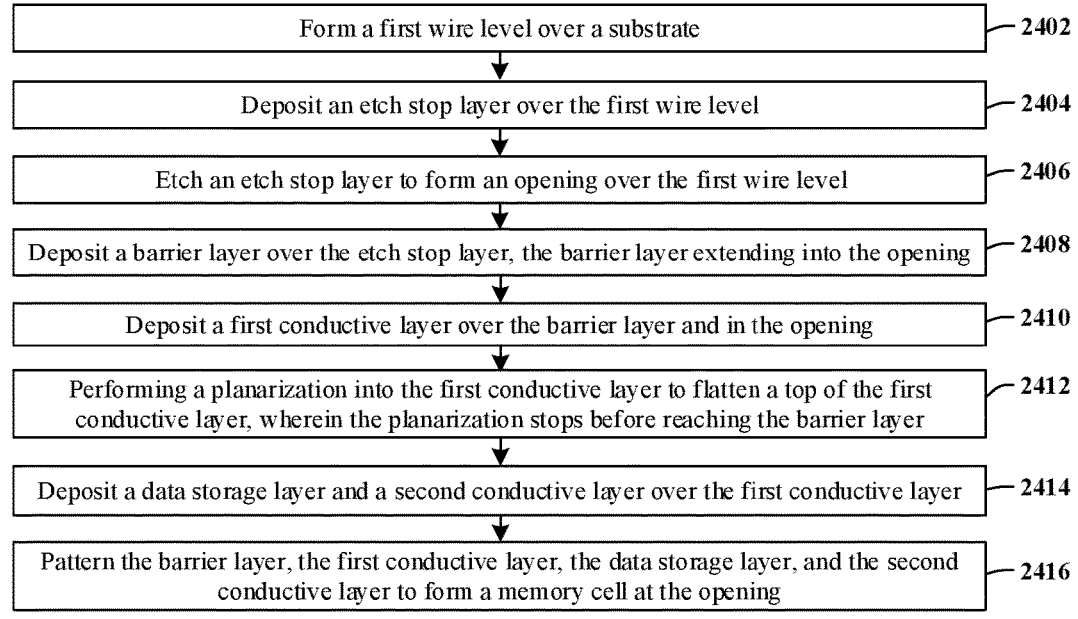

| | |
|---|---|
| Form a first wire level over a substrate | 2402 |
| Deposit an etch stop layer over the first wire level | 2404 |
| Etch an etch stop layer to form an opening over the first wire level | 2406 |
| Deposit a barrier layer over the etch stop layer, the barrier layer extending into the opening | 2408 |
| Deposit a first conductive layer over the barrier layer and in the opening | 2410 |
| Performing a planarization into the first conductive layer to flatten a top of the first conductive layer, wherein the planarization stops before reaching the barrier layer | 2412 |
| Deposit a data storage layer and a second conductive layer over the first conductive layer | 2414 |
| Pattern the barrier layer, the first conductive layer, the data storage layer, and the second conductive layer to form a memory cell at the opening | 2416 |

Fig. 24

INTEGRATION OF VIA AND BOTTOM ELECTRODE FOR MEMORY CELL

BACKGROUND

Many modern day electronic devices include non-volatile memory. Non-volatile memory is electronic memory that is able to store data in the absence of power. A promising candidate for the next generation of non-volatile memory is ferroelectric random-access memory (FeRAM). FeRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 24 illustrates a flow diagram of some embodiments of a method for forming an integrated chip comprising a memory cell with a bottom via and a bottom electrode integrated into a first conductive layer.

DETAILED DESCRIPTION

Figure 1:
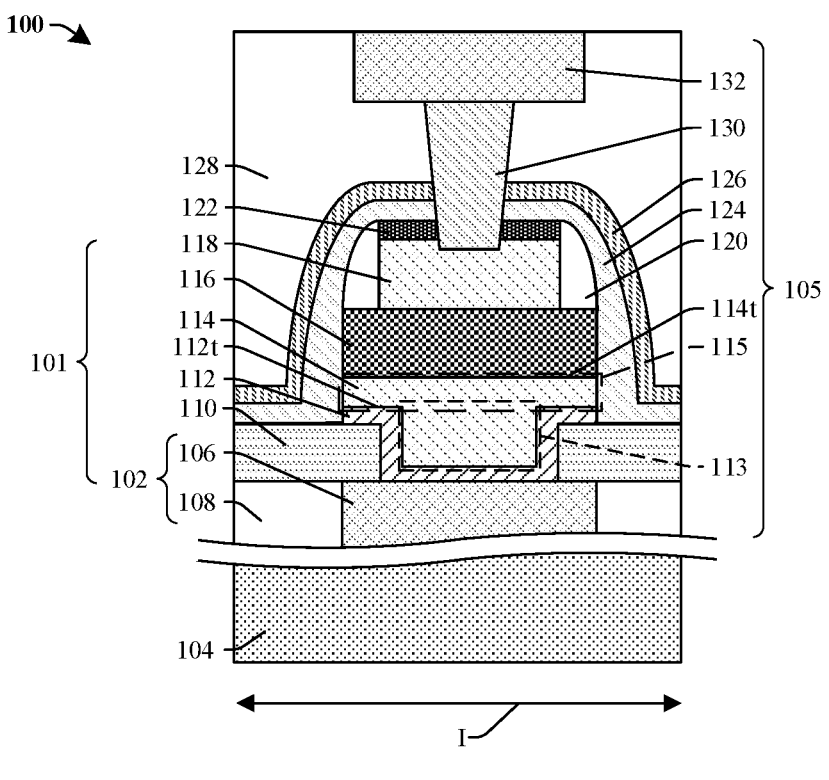
FIG. 1 illustrates a cross-sectional view of some embodiments of an integrated chip comprising a memory cell with a bottom via and a bottom electrode integrated into a first conductive layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A ferroelectric tunnel junction (FTJ) device is a type of ferroelectric random access memory (FeRAM) device that comprises a ferroelectric segment sandwiched between a bottom electrode and a top electrode. The FTJ device is partially formed by depositing an etch stop layer over an underlying wire level, etching an opening into the etch stop layer to expose the wire level, depositing a first conductive material in the opening to form a bottom via, performing a planarization process (e.g., a chemical mechanical planarization process) to remove portions of the first conductive material above the etch stop layer, depositing a second conductive layer over the etch stop layer, and performing a second planarization process to planarize the second conductive layer. A ferroelectric film and the third conductive layer are then deposited. The second conductive layer, the ferroelectric film, and the third conductive film are then patterned into the bottom electrode, the ferroelectric segment, and the top electrode, respectively. The first conductive layer may be separated from the etch stop layer by a barrier layer.

The first and second planarization steps remove excess conductive material and prepare corresponding surfaces for the depositions respectively of the second conductive layer and the ferroelectric film, while separately defining top surfaces of a bottom via and the bottom electrode. A low uniformity in the surface of the second conductive layer (e.g., by not performing a planarization process) may lead to a high degree of variation with, and degradation of, properties of the ferroelectric segment. For example, remanent polarization may have a high degree of variation, whereby bulk manufacturing yields may be low. As another example, remanent polarization may be degraded, whereby read operations may be prone to failure. Therefore, achieving a high degree of uniformity in the surface of the second conductive layer (e.g., by performing a planarization process) may be desirable. However, planarization processes are expensive and time consuming, such that increasing the number of planarization processes performed results in reduced fabrication efficiency and high process costs.

To reduce the process costs and increase the fabrication efficiency of an integrated chip comprising a memory cell (e.g., a ferroelectric tunnel junction (FTJ) cell or the like), various embodiments of the present disclosure are directed towards a method of forming a bottom via and a bottom electrode of a memory cell using a single conductive layer. The conductive layer extends through an opening in an etch stop layer to electrically couple to an underlying wire level. A first portion of the conductive layer in the opening functions as a bottom via. The conductive layer further extends over an uppermost surface of the etch stop layer. A single planarization process is performed on the conductive layer, resulting in the conductive layer having a planarized surface extending over the uppermost surface of the etch stop layer. A second portion of the conductive layer is between the uppermost surface of the etch stop layer and the planarized surface of the conductive layer, where the second portion is configured to function as a bottom electrode. The ferroelectric film and a second conductive layer is then formed over the first conductive layer. The second conductive layer, the ferroelectric film, and the first conductive layer are patterned, forming a top electrode, a ferroelectric segment, and a conductive structure of a memory cell.

In a completed memory cell, the conductive structure functions as both a bottom via and a bottom electrode. A portion of the conductive structure in the opening couples the memory cell to the underlying wire level, and a portion of the conductive structure over the opening evenly applies a bias voltage to one side of the ferroelectric segment during operation. Removing a planarization process from the method while maintaining a uniform surface to deposit the ferroelectric film over results in a manufacturing process with reduced process time and costs without sacrificing functionality or yields, leading to greater fabrication efficiency.

FIG. 1 illustrates a cross-sectional view 100 of some embodiments of an integrated chip comprising a memory cell with a bottom via and a bottom electrode integrated into a first conductive layer.

The integrated chip comprises a memory cell 101 over a substrate 104. In some embodiments, the memory cell 101 is or comprises an FTJ cell or the like. The memory cell 101 is in a first region I of the integrated chip and is integrated into an interconnect structure 105. The memory cell 101 is sandwiched between lower wires 106 (only one of which is shown) and upper wires 132 (only one of which is shown). The lower wires 106 are surrounded by a first dielectric layer 108 of a plurality of intermetal dielectric (IMD) layers. The lower wires 106 and the first dielectric layer 108 are part of a first wire level 102. The upper wires 132 and the memory cell 101 are surrounded by a second dielectric layer 128 of the plurality of IMD layers. A first spacer 120, a second etch stop layer 124, a buffer layer 126, and a hard mask layer 122 extend between the memory cell 101 and the second dielectric layer 128.

The memory cell 101 comprises a conductive structure 114, a ferroelectric segment 116, and a top electrode 118. The conductive structure 114 overlies a first etch stop layer 110, and has a first portion 113 extending into the first etch stop layer 110. A barrier layer 112 spaces the conductive structure 114 from the first wire level 102 and the first etch stop layer 110. In some embodiments, the first portion 113 of the conductive structure 114 is confined between inner sidewalls of the barrier layer, while a second portion 115 of the conductive structure 114 is confined above a topmost surface 112t of the barrier layer 112. The conductive structure 114 has a planarized surface 114t that extends directly over topmost surfaces of the barrier layer 112 and the etch stop layer 110. The barrier layer 112 spaces the planarized surface 114t of the conductive structure 114 from the first etch stop layer 110.

The ferroelectric segment 116 separates the conductive structure 114 from the top electrode 118. The ferroelectric segment 116 may have a first polarization and a second polarization, respectively represented by a first data state (e.g., logical "0") and a second state (e.g., logical "1"). The polarization of the ferroelectric segment 116 is set by applying either a first voltage or a second voltage across the ferroelectric segment 116. The voltages are applied through biasing the top electrode 118 and the conductive structure 114. The top electrode 118 is electrically coupled to upper wires 132 by a top via 130. The second portion 115 of the conductive structure 114 functions as a bottom electrode, and is electrically coupled to the lower wires 106 by the first portion 113 and the barrier layer 112, which together function as a via.

The method of forming the memory cell 101 described further on in this disclosure reduces the number of planarization steps used in forming the conductive structure 114. The conductive structure 114 combines the functionality of a bottom via and a bottom electrode into a single feature with no loss in performance. A lower number of planarization processes performed results in a shorter manufacturing time and a more cost efficient design while maintaining the uniformity of the planarized surface 114t that reinforces the ferroelectric properties of the ferroelectric segment 116.

Figure 2:
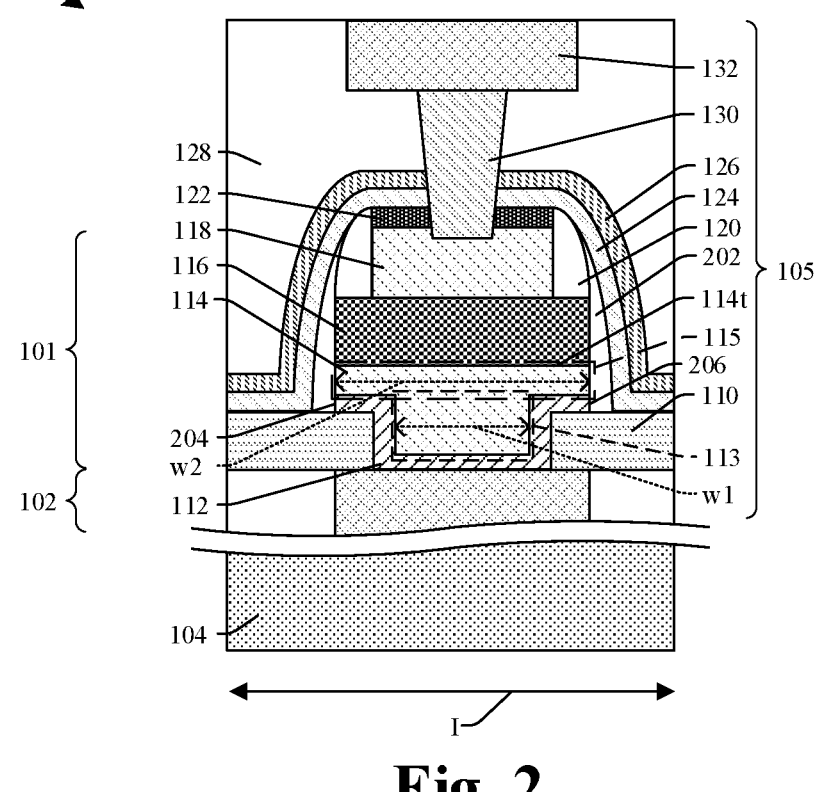
FIG. 2 illustrates a cross-sectional view of some embodiments of an integrated chip comprising a memory cell with a bottom via and a bottom electrode integrated into a first conductive layer.

FIG. 2 illustrates a cross-sectional view 200 of some embodiments of an integrated chip comprising a memory cell with a bottom via and a bottom electrode integrated into a first conductive layer.

The first spacer 120 overlies the ferroelectric segment 116 and covers outer sidewalls of the top electrode 118 and the hard mask layer 122. In some embodiments, a second spacer 202 overlies the first etch stop layer 110 and extends up outer sidewalls of the barrier layer 112, the conductive structure 114, and the ferroelectric segment 116. In some embodiments, the second etch stop layer 124 covers and conforms to the memory cell 101, the first spacer 120, the second spacer 202, and the first etch stop layer 110. In further embodiments, the buffer layer 126 covers and conforms to the second etch stop layer 124.

In some embodiments, the barrier layer 112 extends from a first outer sidewall 204 directly beneath a first edge of the planarized surface 114t to a second outer sidewall 206 directly beneath a second edge of the planarized surface 114t opposite the first edge. In some embodiments, the etch stop layer 110 surrounds the first portion 113 of the conductive structure 114, wherein the etch stop layer 110 is directly between the second portion 115 of the conductive structure 114 and the first wire level 102, and wherein the etch stop layer 110 is separated from the conductive structure 114 by the barrier layer 112. In some embodiments, an upper surface of the barrier layer 112 is at an elevation level with both a top of the first portion 113 and a bottom of the second portion 115 of the conductive structure 114.

In some embodiments, the first portion 113 is configured to function as a bottom via and has a first width w1, and the second portion 115 is configured to function as a bottom electrode and has a second width w2 that is greater than the first width w1 and is equal to a width of the barrier layer. In some embodiments, the second portion 115 of the conductive structure 114 is a pad and the first portion 113 is a protrusion extending through the etch stop layer from the pad, wherein the protrusion has a substantially constant first width w1, and wherein the pad overlies the etch stop structure and the protrusion and has a substantially constant second width w2, wherein the second width w2 is greater than the first width w1. In further embodiments, the pad and the protrusion of the conductive structure 114 form a "T" shape when viewed from a cross-sectional view, and wherein the barrier layer 112 extends along bottom surfaces of the "T" shape. In some embodiments, the barrier layer 112, the conductive structure 114, and the ferroelectric segment 116 form a common sidewall directly over the etch stop layer 110. In further embodiments, the barrier layer 112 has an outer sidewall facing a same direction as the common sidewall and directly between inner sidewalls of the etch stop layer 110.

Figure 3A:
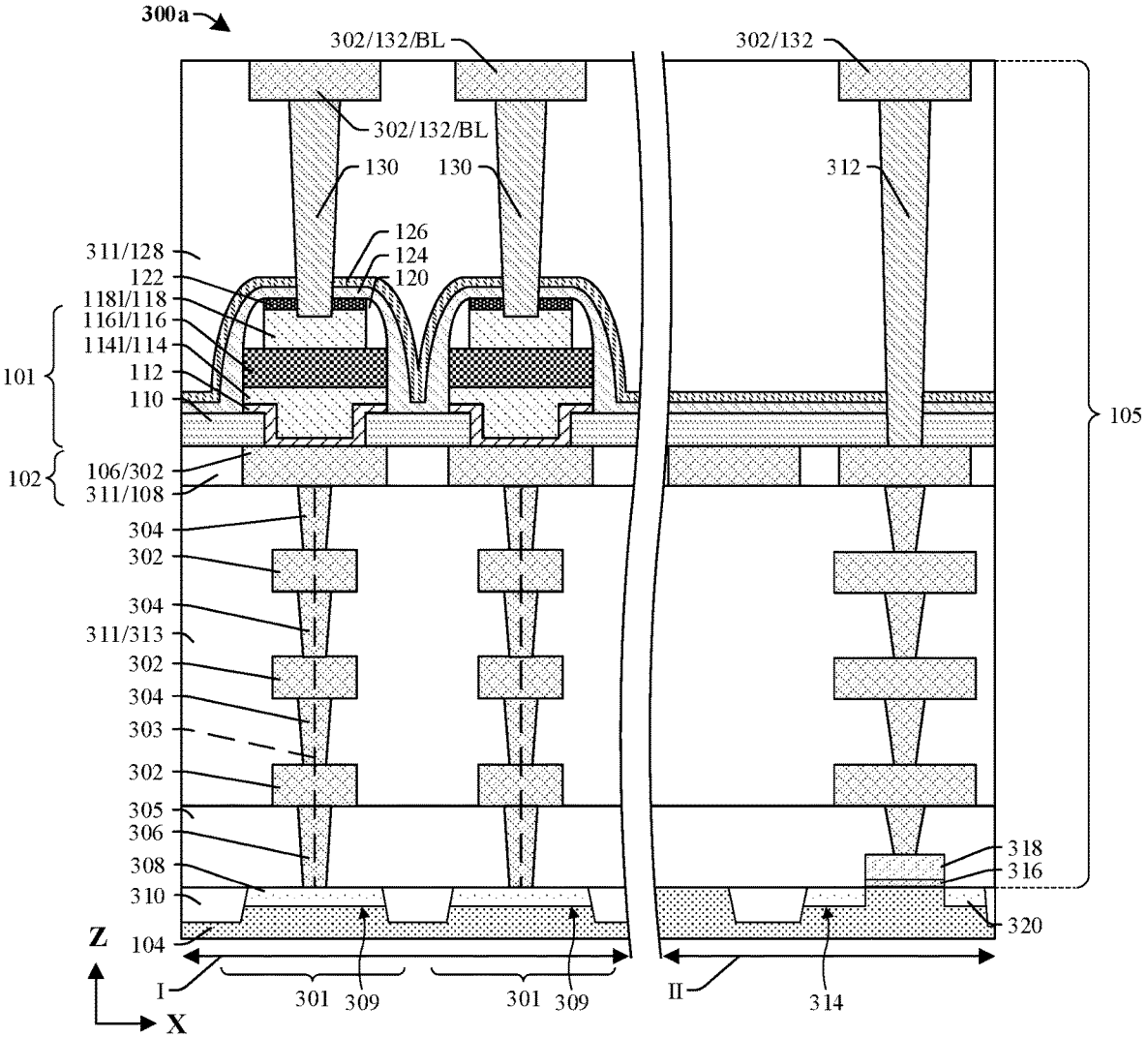
FIGS. 3A-3B illustrate cross-sectional views of some embodiments of an integrated chip comprising a memory cell with a bottom via and a bottom electrode integrated into a first conductive layer.
Figure 3B:
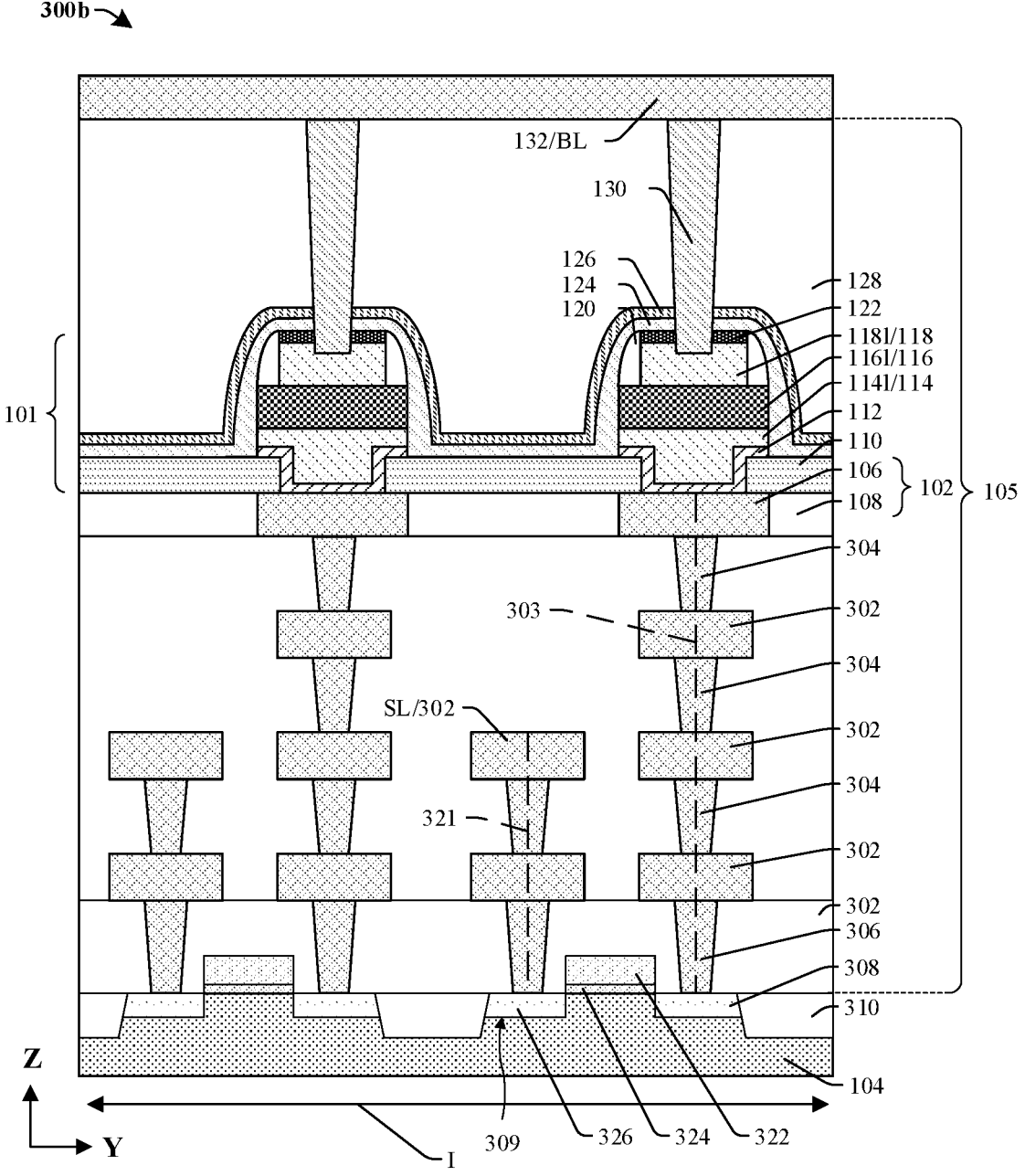

FIGS. 3A-3B illustrate cross-sectional views of some embodiments of an integrated chip comprising a memory cell with a bottom via and a bottom electrode integrated into a first conductive layer, where the memory cells 101 are further integrated into individual one-transistor one-resistor (1T1R) cells 301. The memory cells are each as their counterpart is described with regard to FIG. 1.

The 1T1R cells 301 comprise individual drain regions 308 and individual drain-side conductive paths 303. The drain regions 308 are doped regions of a substrate 104 and each has an opposite doping type as an adjoining region of the substrate 104. Further, the drain regions 308 are electrically separated by a trench isolation structure 310 and partially define access transistors 309 (partially shown) used to individually select the memory cells 101. The trench isolation structure 310 extends into a top of the substrate 104 and comprises silicon oxide and/or some other suitable dielectric material(s). The substrate 104 may, for example, be a bulk silicon substrate or some other suitable semiconductor substrate.

The drain-side conductive paths 303 electrically couple the drain regions 308 to the memory cells 101 and are formed by an interconnect structure 105 within which the memory cells 101 are arranged. The interconnect structure 105 comprises a plurality of wires 302 and a plurality of vias 304. The plurality of wires 302 comprises the lower wires 106 and the upper wires 132. In some embodiments, the upper wires 132 coupled to the memory cells 101 correspond to bit lines BL. The plurality of vias 304 comprises TEVAs. A plurality of contacts 306 electrically couples the drain regions 308 to the plurality of wires 302. The plurality of contacts 306 is in an interlayer dielectric (ILD) layer 305, whereas the plurality of vias 304 and the plurality of wires 302 are in IMD layers 311. The IMD layers 311 comprise the first dielectric layer, the second dielectric layer, and the intermediate dielectric layers 313. The plurality of wires 302 and the plurality of vias 304, may be or comprise, for example, copper, aluminum, some other suitable metal(s), or any combination of the foregoing.

A peripheral region II to a side of the 1T1R cells 301 accommodates peripheral devices 314 (only one of which is shown). The peripheral devices 314 may, for example, be metal-oxide-semiconductor field-effect transistors (MOSFETs), fin field-effect transistors (finFETs), gate-all-around field-effect transistors (GAA FETs), or some other suitable type of semiconductor device. Each of the peripheral devices 314 comprises a pair of source/drain regions 320 in the substrate 104, as well as a gate electrode 318 and a gate dielectric layer 316 stacked between the source/drain regions 320. A conductive path in the second region II couples the peripheral devices 314 to extended vias 312. The extended vias 312 electrically couple the lower wires 106 to the upper wires 132, and extend from an elevation level with a bottom of the barrier layer 112 to an elevation level with a top of the top via 130.

With reference to FIG. 3B, a cross-sectional view 300b of some embodiments of the IC chip of FIG. 3A is provided along an axis orthogonal to that which the cross-sectional view 300a of FIG. 3A is taken. The 1T1R cells 301 comprise individual memory cells 101, individual drain-side conductive paths 303, individual access transistors 309, and individual source-side conductive paths 321. The memory cells 101 are each as their counterpart is described with regard to FIG. 1.

The access transistors 309 are on the substrate 104, between the substrate 104 and the interconnect structure 105, and are electrically separated by the trench isolation structure 310. The access transistors 309 comprise individual drain regions 308, individual source regions 326, individual gate dielectric layers 324, and individual gate electrodes 322. The gate electrodes 322 respectively overlie the gate dielectric layers 324 and, in some embodiments, form word lines. The drain and source regions 308, 326 are doped regions of the substrate 104 and each has an opposite doping type as an adjoining region of the substrate 104. Further, the drain and source regions 308, 326 respectively border the gate electrodes 322. The access transistors 309 may, for example, be MOSFETs, finFETs, GAA FETs, or some other suitable type of semiconductor device.

The drain-side conductive paths 303 electrically couple the drain regions 308 to the memory cells 101, and the source-side conductive paths 321 electrically couple the source regions 326 to source lines SL. The drain-side and source-side conductive paths 303, 321 are formed by the plurality of wires 302, the plurality of vias 304, and the plurality of contacts 306.

Figure 4:
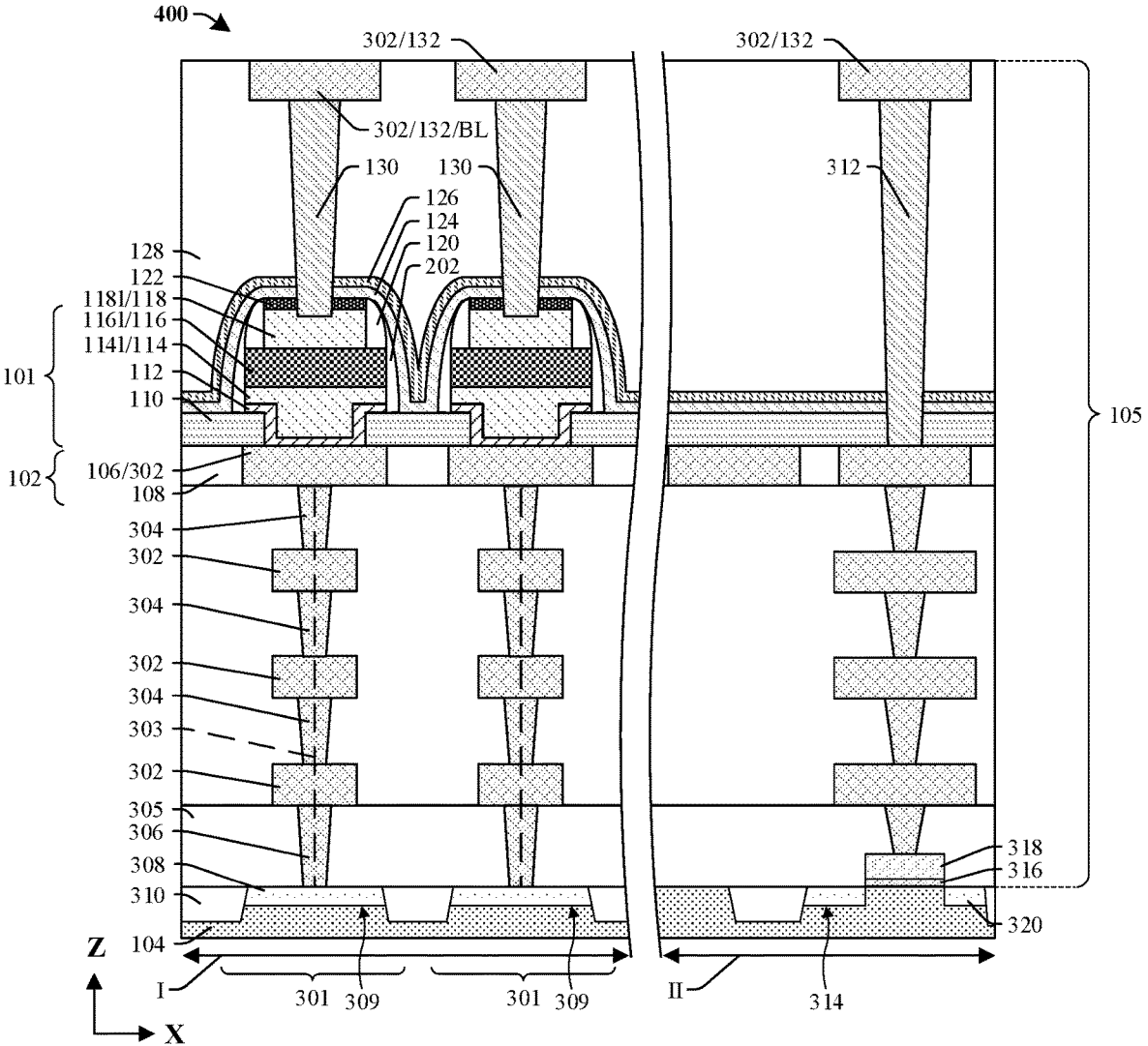
FIG. 4 illustrates a cross-sectional view of some embodiments of an integrated chip comprising a memory cell with a bottom via and a bottom electrode integrated into a first conductive layer.

While FIGS. 3A and 3B are illustrated using memory-cell embodiments as in FIG. 1, memory-cell embodiments as in FIG. 2 are amenable to alternative embodiments. For example, as illustrated by the cross-sectional view 400 of FIG. 4, the memory cells 101 of FIGS. 3A-3B may alternatively be configured as in FIG. 2.

FIGS. 5-23 illustrate a series of cross-sectional views of some embodiments of a method for forming an integrated chip comprising a memory cell with a bottom via and a bottom electrode integrated into a first conductive layer. The method may, for example, be employed to form the integrated chip of FIG. 4 or the like. Although FIGS. 5-23 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part. The portion of the interconnect structure 105 below the first wire level 102 is not shown in FIGS. 5-23 for ease of clarity.

Figure 5:
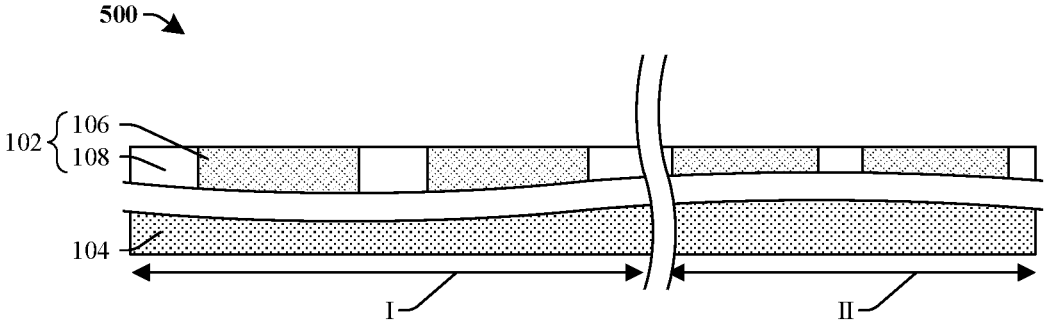
FIGS. 5-23 illustrate a series of cross-sectional views of some embodiments of a method for forming an integrated chip comprising a memory cell with a bottom via and a bottom electrode integrated into a first conductive layer.

As shown in the cross-sectional view 500 of FIG. 5, the first wire level 102 is formed over the substrate 104. The first wire level 102 comprises the lower wires 106 spaced by the first dielectric layer 108 of the IMD layers 311 (See FIG. 3A). In some embodiments, the lower wires 106 are or comprise one of polysilicon, copper (e.g., Cu), titanium nitride (e.g., TiN), tungsten (e.g., W), aluminum (e.g., Al), tantalum nitride (e.g., TaN), the like, or any combination of the foregoing. In some embodiments, the first wire level 102 extends over a first region I and a second region II of the integrated chip.

Figure 6:
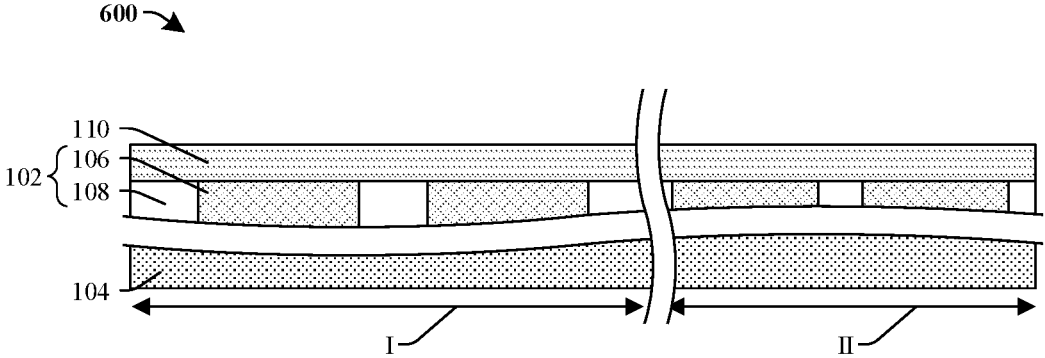

As shown in the cross-sectional view 600 of FIG. 6, the etch stop layer 110 is deposited over the first wire level 102 in the first region I and in the second region II. In some embodiments, the etch stop layer 110 may, for example, be deposited by a physical vapor deposition (PVD), a chemical vapor deposition (CVD), or an atomic layer deposition (ALD) process, and may be or comprise a nitride (e.g., silicon nitride), a carbide (e.g., silicon carbide), an oxide, the like, or any combination of the foregoing.

Figure 7:
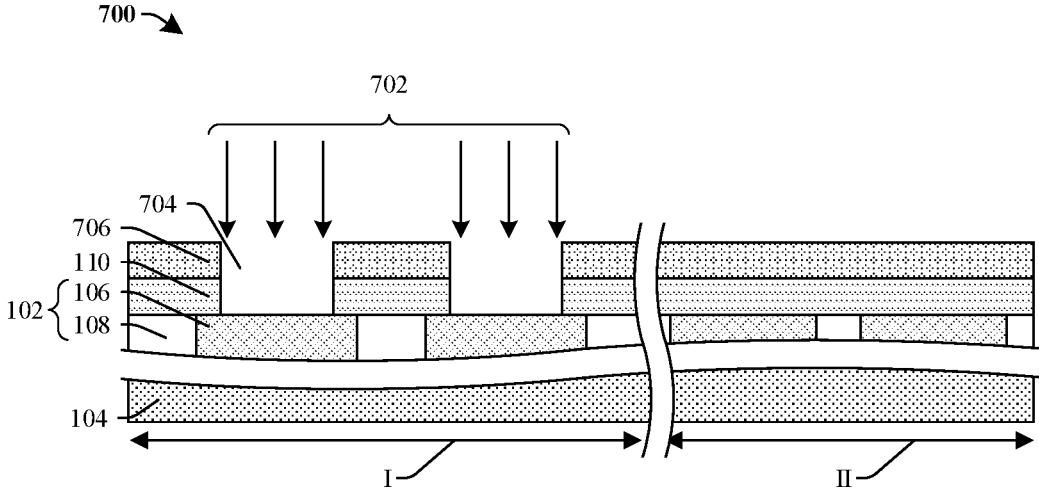

As shown in the cross-sectional view 700 of FIG. 7, the etch stop layer 110 is patterned by a first etching process 702, forming an opening 704 in the etch stop layer 110. The patterning comprises forming a first masking layer 706 (e.g., positive/negative photoresist, a hard mask, etc.) over the etching layer. The first masking layer 706 is formed by depositing the first masking layer 706 (e.g., via a spin-on process), and then patterning the first masking layer 706 (e.g., via a lithography process, such as extreme ultraviolet lithography, or the like). The pattern is such portions of the etch stop layer 110 corresponding to the opening 704 are exposed to the first etching process 702. The first etching process 702 is then performed, etching the etch stop layer 110 according to the pattern of the first masking layer 706. The first etching process 702 is or comprises a wet etching process, a dry etching process, or some other suitable etching process. The first masking layer 706 is then removed. In some embodiments, the first masking layer 706 is removed using one or more etching processes, one or more stripping processes, one or more ashing processes, some other process, or a combination of the foregoing.

Figure 8:
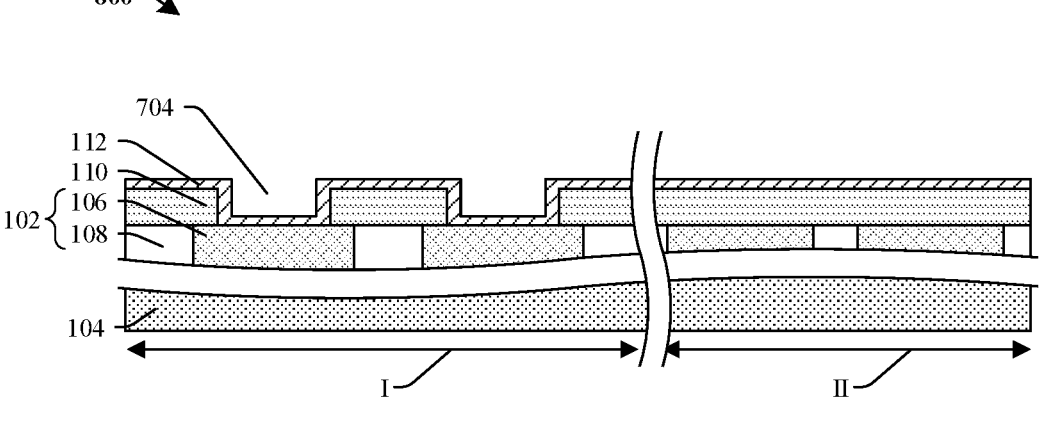

As shown in the cross-sectional view 800 of FIG. 8, the barrier layer 112 is deposited over the etch stop layer 110. The barrier layer 112 extends into the opening 704. In some embodiments, the barrier layer 112 is or comprises one of a metal (e.g., nickel), a nitride (e.g., tantalum nitride, titanium nitride), other conductive material(s), or any combination of the foregoing. In some embodiments, the barrier layer 112 may, for example, be deposited by a PVD, CVD, or ALD process.

Figure 9:
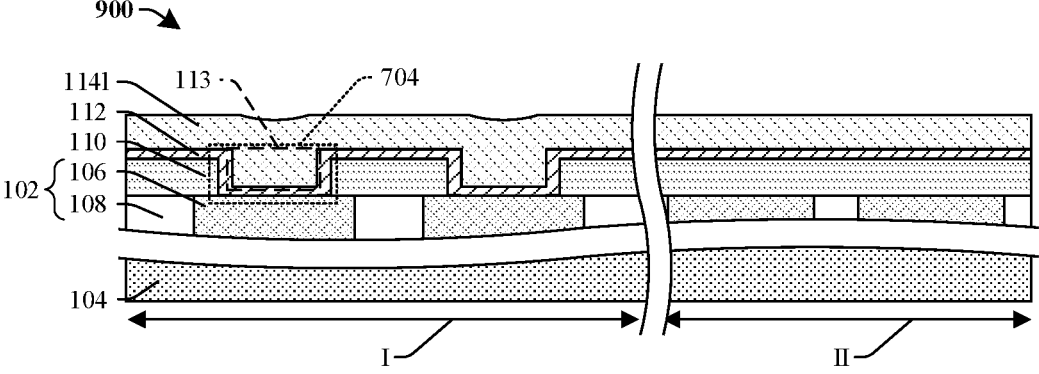

As shown in the cross-sectional view 900 of FIG. 9, the first conductive layer 1141 is deposited over the barrier layer 112. The first portion 113 of the first conductive layer 1141 fills the opening 704 (shown in phantom), and covers the barrier layer 112. The opening 704 defines the first portion 113, which is configured to function as a bottom via. Conductive material that will form the second portion 115 (See FIG. 2) is also deposited in this process. Depositing both the first portion 113 and the second portion 115 of the conductive structure 114 in one deposition process removes a planarization step from the manufacturing process, thereby lowering the time and expense required to form the integrated chip.

In some embodiments, the first conductive layer 1141 has uneven top surface extending over the opening 704. In some embodiments, the first conductive layer 1141 may, for example, be deposited by a PVD. CVD, or ALD process. In some embodiments, the deposition of the first conductive layer 1141 is performed using a first deposition step, where the first portion 113 and the second portion 115 of the conductive structure 114 are formed during the first deposition step.

Figure 10:
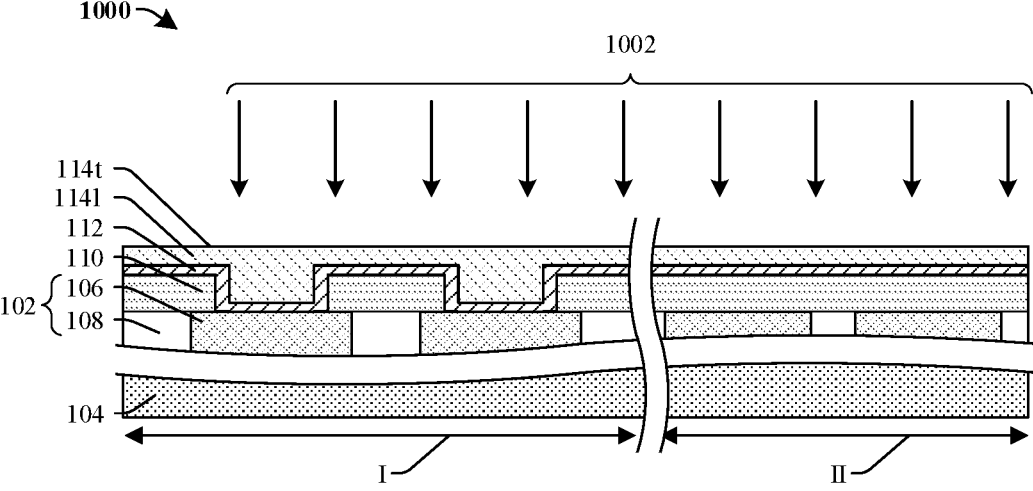

As shown in the cross-sectional view 1000 of FIG. 10, a planarization process 1002 is performed on the first conductive layer 1141. The planarization process 1002 results in the first conductive layer 1141 having a planarized surface 114t. The planarized surface 114t extends directly over topmost surfaces of the etch stop layer 110 and the barrier layer 112. The barrier layer 112 spaces the planarized surface 114t of the first conductive layer 1141 from the etch stop layer 110. In some embodiments, the planarization process 1002 may be, for example, a chemical-mechanical planarization (CMP) process or some other suitable planarization process.

A single CMP process being used to form the first conductive layer 1141 lowers the time and expense needed to form the memory cell 101 (See FIG. 1) while maintaining the planarized surface conducive to high yields and the beneficial properties of the ferroelectric segments 116 (see FIG. 1). For example, while an uneven surface may degrade the remanent polarization of the ferroelectric segment 116, this property may be reinforced in a highly uniform surface.

Figure 11:
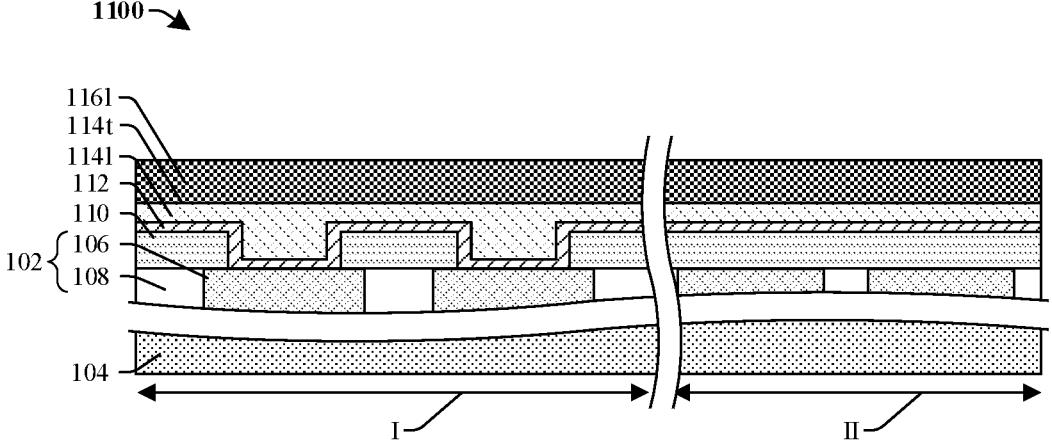

As shown in the cross-sectional view 1100 of FIG. 11, the ferroelectric film 1161 is deposited over the planarized surface 114t of the first conductive layer 1141. The deposition may, for example, be performed by CVD, PVD, ALD, the like, or any combination of the foregoing. In some embodiments, the ferroelectric film 1161 is or comprises a binary oxide, a ternary oxide or nitride, a quaternary oxide, some other suitable ferroelectric material(s), or any combination of the foregoing. The binary oxide may, for example, be or comprise hafnium oxide (e.g., hafnia or $HfO_2$) and/or some other suitable binary oxide(s). In some embodiments, the ferroelectric film may more generally be a data storage layer.

Figure 12:
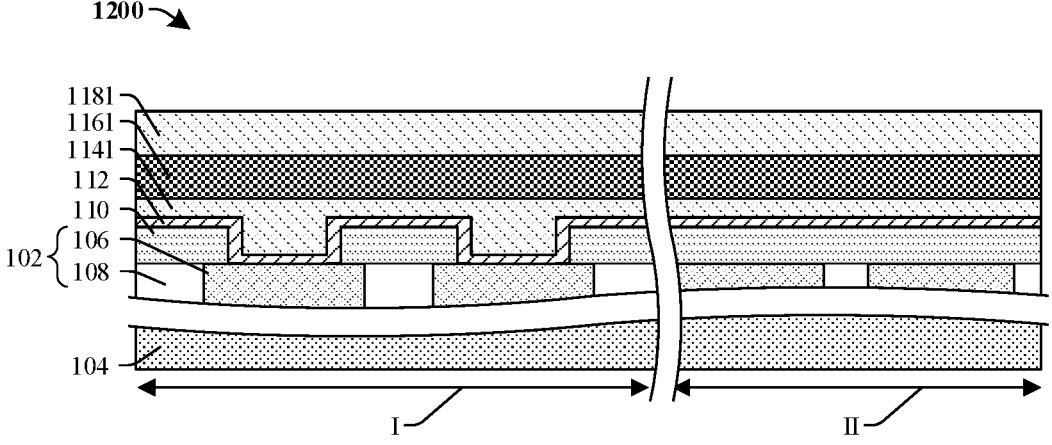

As shown in the cross-sectional view 1200 of FIG. 12, the second conductive layer 1181 is deposited over the ferroelectric film 1161. The deposition may, for example, be performed by CVD, PVD, ALD, the like, or any combination of the foregoing. The first and second conductive layer 1141, 1181 are or comprise copper, aluminum, tungsten, the like, or any combination of the foregoing.

Figure 13:
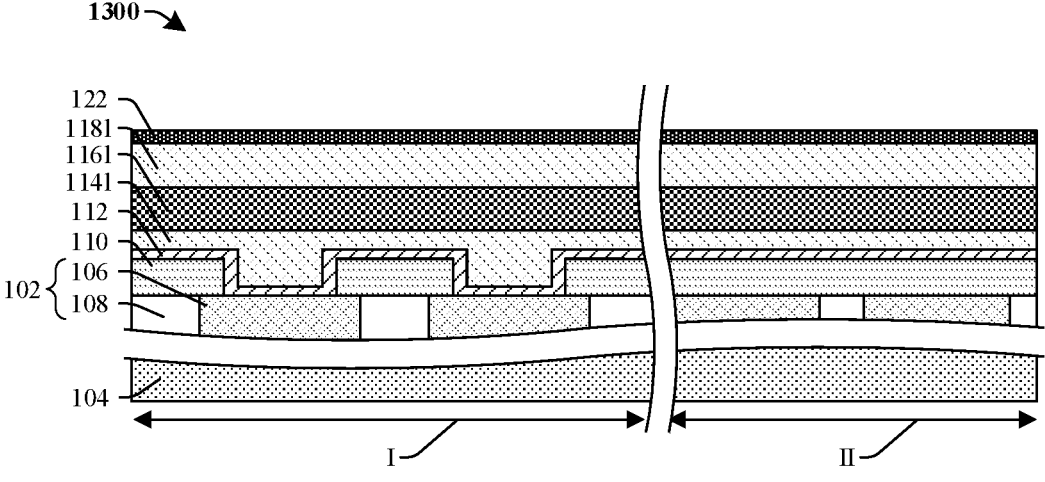

As shown in the cross-sectional view 1300 of FIG. 13, the hard mask layer 122 is deposited over the second conductive layer 1181. The deposition may, for example, be performed by CVD, PVD, ALD, the like, or any combination of the foregoing. The hard mask layer 122 may, for example, be or comprise titanium nitride, silicon oxide, silicon nitride, silicon carbide nitride, silicon oxide nitride, metal oxide, some other suitable material(s), or any combination of the foregoing.

Figure 14:
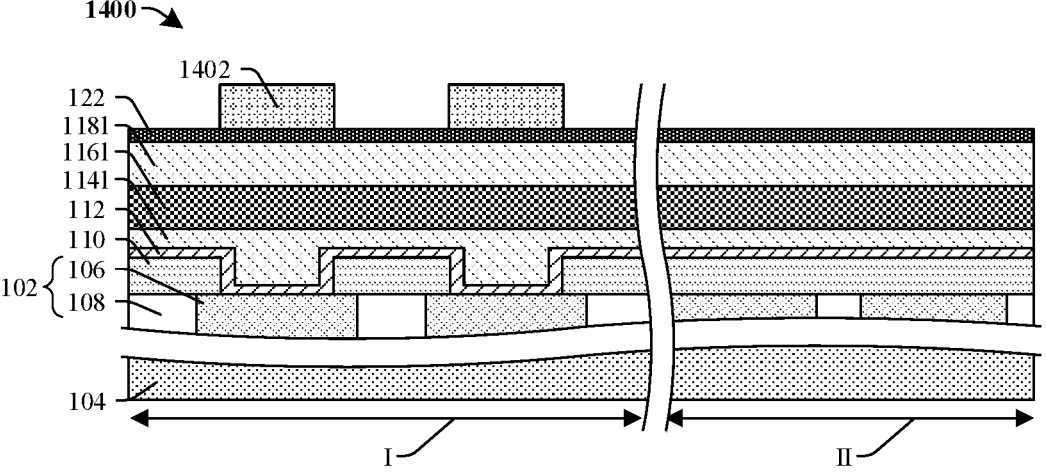

As shown in the cross-sectional view 1400 of FIG. 14, a second masking layer 1402 is formed over the hard mask layer 122. In some embodiments, the second masking layer 1402 is patterned to cover portions of the second conductive layer 1181 corresponding to the top electrode 118 of FIG. 1. In some embodiments, the second masking layer 1402 is formed by depositing the second masking layer 1402 (e.g., via a spin-on process), and then patterning the second masking layer 1402 (e.g., via a lithography process, such as extreme ultraviolet lithography, or the like).

Figure 15:
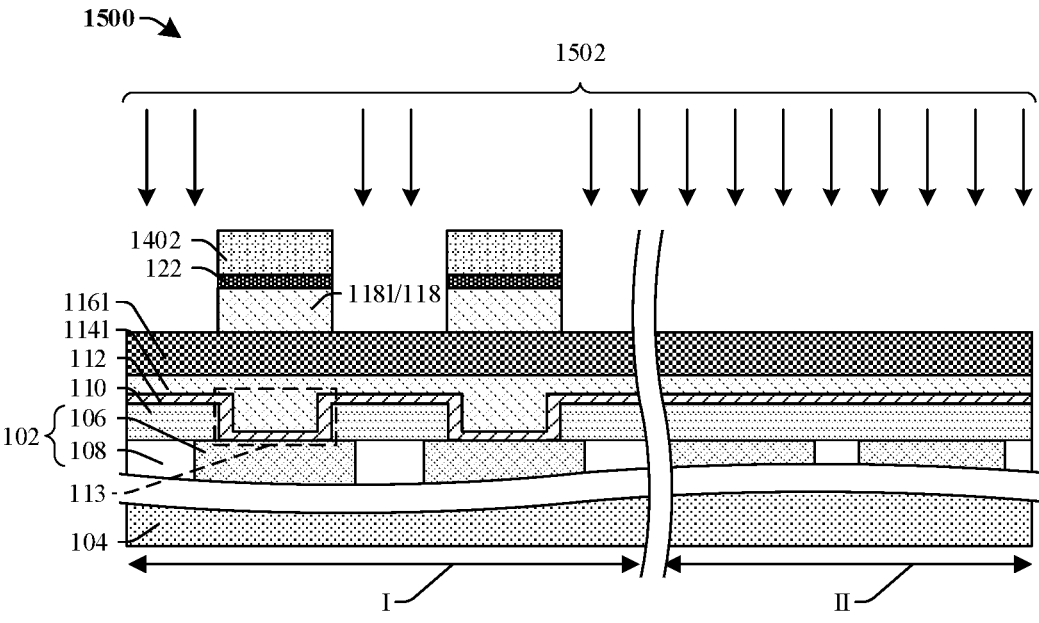

As shown in the cross-sectional view 1500 of FIG. 15, the hard mask layer 122 and the second conductive layer 1181 are patterned by a second etching process 1502 according to the pattern of the second masking layer 1402. The second etching process 1502 exposes the ferroelectric film 1161 and defines a top electrode 118 over the first portion 113. The second etching process 1502 is or comprises a wet etching process, a dry etching process, or some other suitable etching process.

Figure 16:
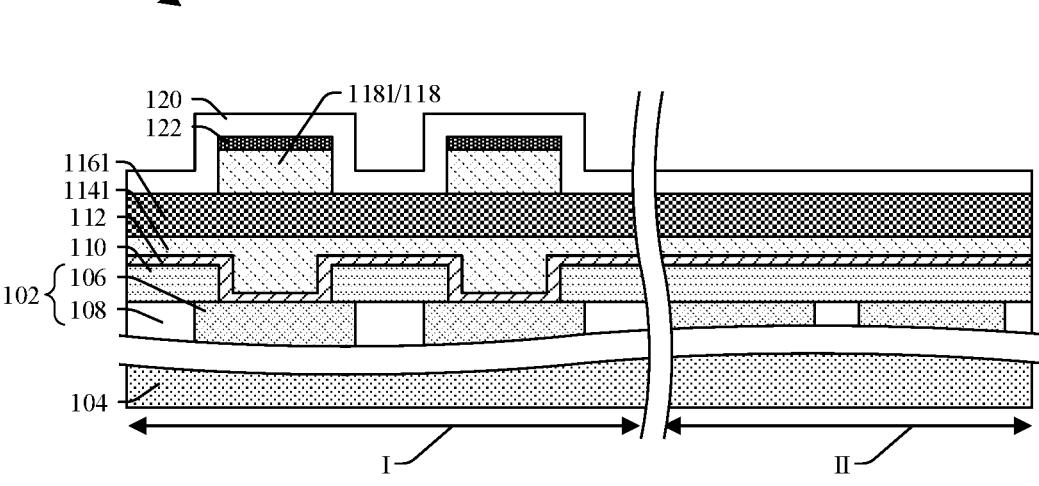

As shown in the cross-sectional view 1600 of FIG. 16, the second masking layer 1402 is removed. Further, a first spacer layer 1201 is deposited over the portions of the ferroelectric film 1161 exposed by the second etching process 1502 (See FIG. 15). The first spacer layer 1201 surrounds the top electrode 118. In some embodiments, the first spacer layer 1201 is or comprises titanium nitride, silicon oxide, silicon nitride, silicon carbide nitride, silicon oxide nitride, a metal oxide, some other suitable material(s), or any combination of the foregoing. The deposition may, for example, be performed by CVD, PVD, ALD, the like, or any combination of the foregoing.

Figure 17:
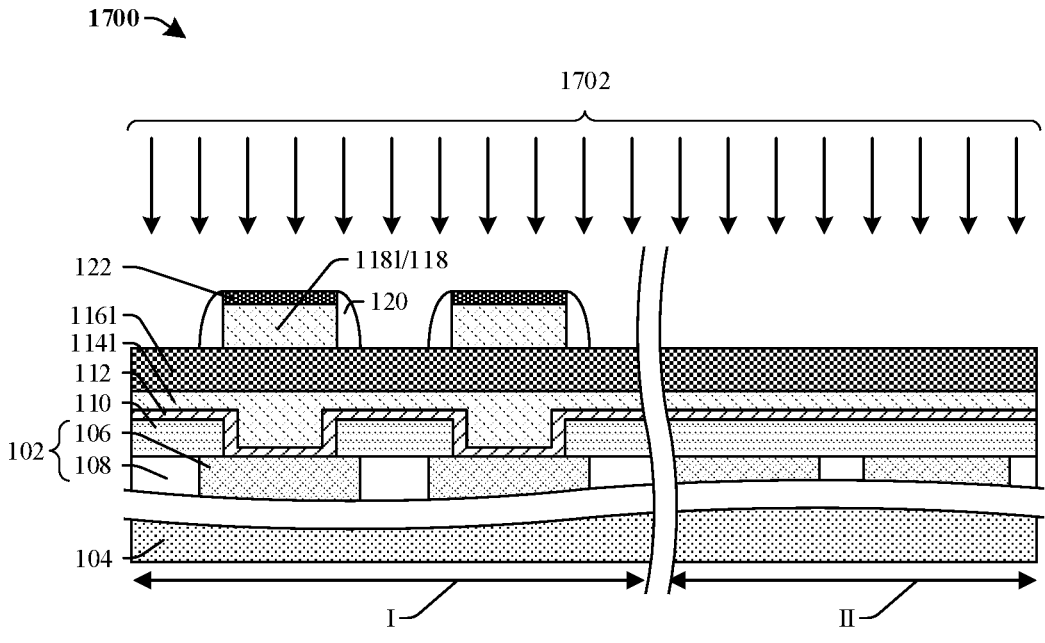

As shown in the cross-sectional view 1700 of FIG. 17, an etch back 1702 is performed on the first spacer layer 1201 to form the first spacer 120. The etch back may, for example, be performed by a vertical and/or anisotropic etch or the like. The etch back removes horizontal segments of the first spacer layer 1201, thereby localizing the first spacer 120 to sidewalls (e.g., sidewalls of the top electrode 118).

Figure 18:
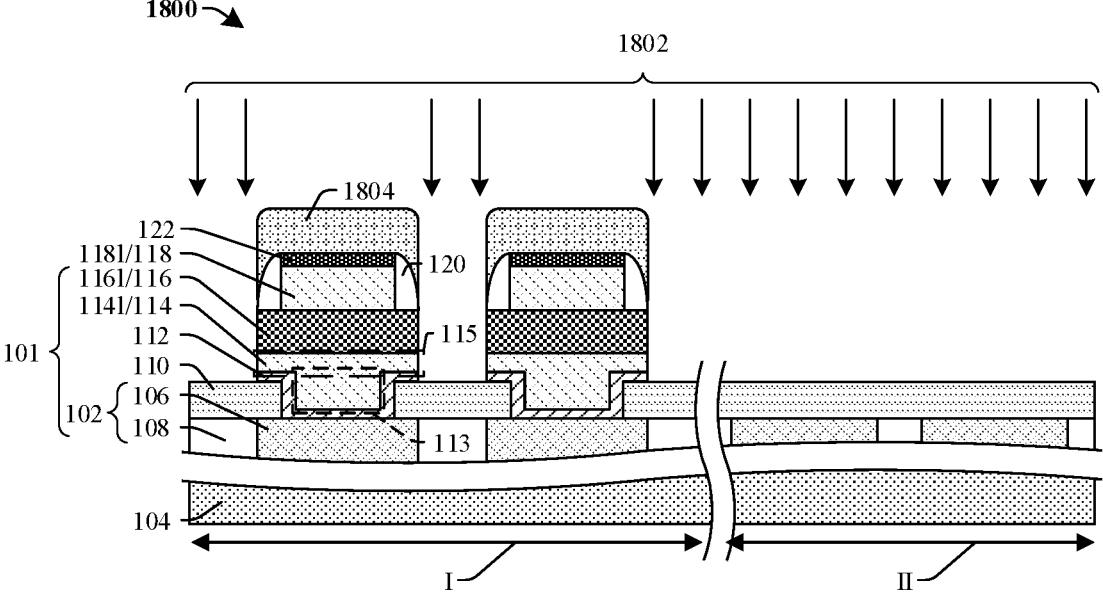

As shown in the cross-sectional view 1800 of FIG. 18, a third etching process 1802 is performed, removing portions of the ferroelectric film 1161, the first conductive layer 1141, and the barrier layer 112. In some embodiments, a third masking layer 1804 is formed over the hard mask layer 122 and the first spacer 120, leaving portions of the ferroelectric film 1161 exposed to the third etching process 1802. The third etching process 1802 segments the ferroelectric film 1161 into portions individual to the memory cells being formed, such as the ferroelectric segment 116. In some embodiments, the ferroelectric segment may more generally be a data storage structure. The third etching process 1802 further segments the first conductive layer 1141 into segments individual to the memory cells 101 being formed, such as the conductive structure 114. In some embodiments, the third etching process 1802 defines outermost sidewalls of the second portion 115 of the conductive structure 114. The second portion 115 of the conductive structure 114 is configured to function as a bottom electrode of the memory cell 101. The third etching process 1802 results in the outermost sidewalls of the barrier layer 112 being aligned with the outermost sidewalls of the conductive structure 114 and the ferroelectric segment 116, such that the topmost surface of the barrier layer 112 extends to an outermost sidewall of the conductive structure 114. In some embodiments, the third etching process 1802 is or comprises a wet etching process, a dry etching process, or some other suitable etching process.

Figure 19:
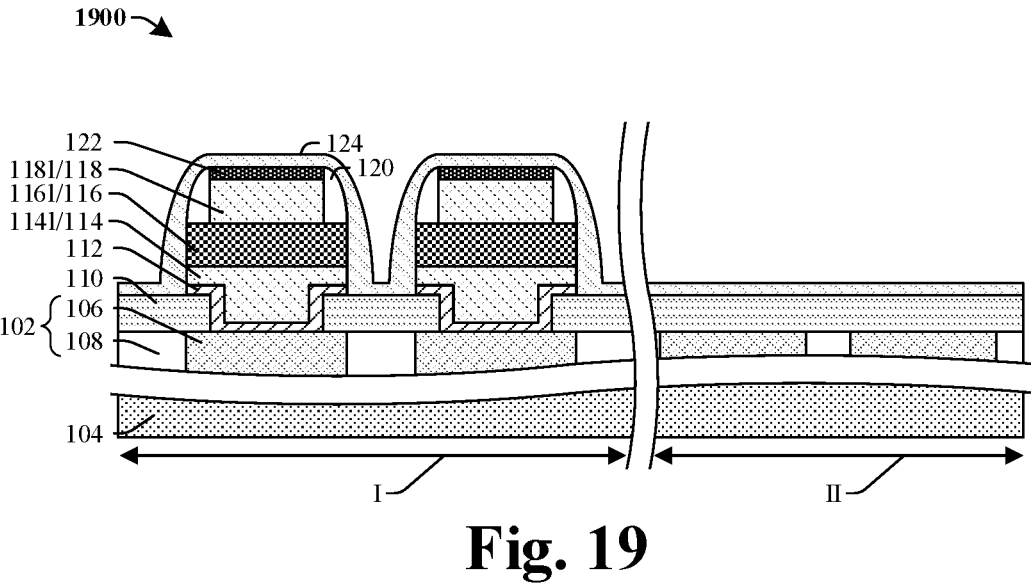

As shown in the cross-sectional view 1900 of FIG. 19, the second etch stop layer 124 is deposited over the memory cell 101. The second etch stop layer 124 covers and conforms to the first etch stop layer 110 and the memory cell 101. In some embodiments, the second etch stop layer 124 extends over the second region II. In some embodiments, the second etch stop layer 124 comprises a same material as the first etch stop layer 110. The deposition may, for example, be performed by CVD, PVD, ALD, the like, or any combination of the foregoing.

Figure 20:
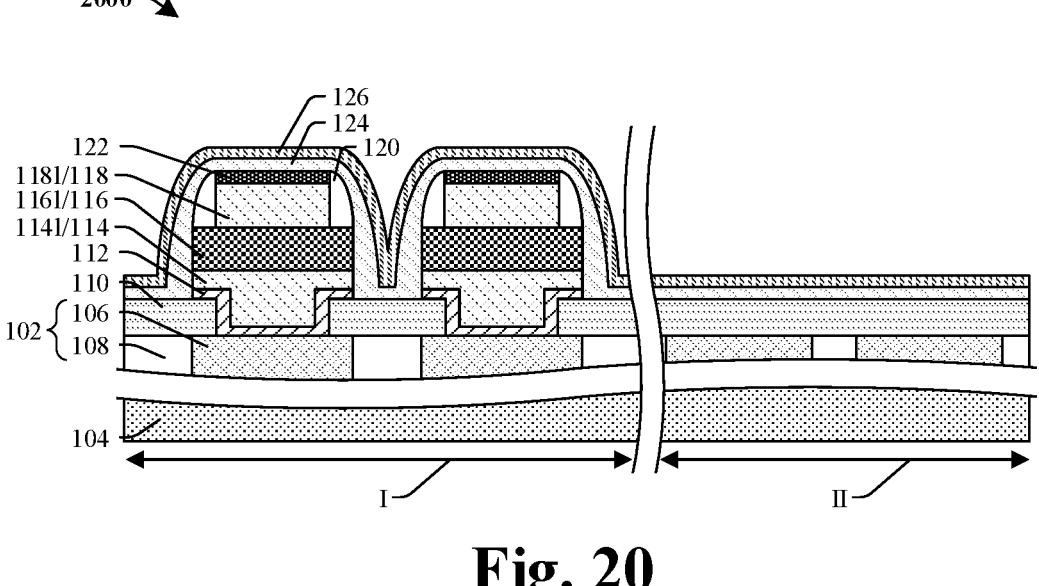

As shown in the cross-sectional view 2000 of FIG. 20, the buffer layer 126 is deposited over the second etch stop layer 124. The buffer layer 126 covers and conforms to the second etch stop layer 124. In some embodiments, the buffer layer 126 is or comprises tetraethyl orthosilicate (TEOS) oxide and/or some other suitable dielectric(s). In some embodiments, the buffer layer 126 extends over the second region II. The deposition may, for example, be performed by CVD, PVD, ALD, the like, or any combination of the foregoing.

Figure 21:
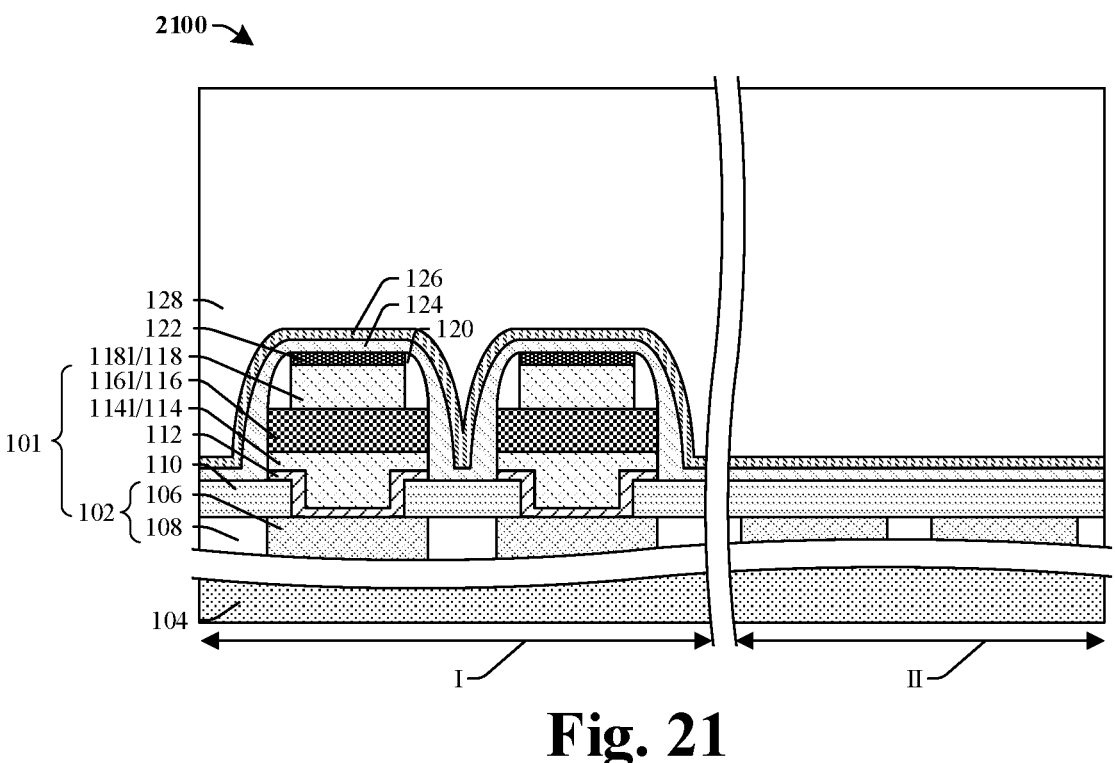

As shown in the cross-sectional view 2100 of FIG. 21, the second dielectric layer 128 of the IMD layers 311 is deposited over the first and second regions I, II. In some embodiments, the second dielectric layer 128 comprises a same material as a first dielectric layer 108. The second dielectric layer 128 covers the memory cell 101. The deposition may, for example, be performed by CVD, PVD, ALD, the like, or any combination of the foregoing.

Figure 22:
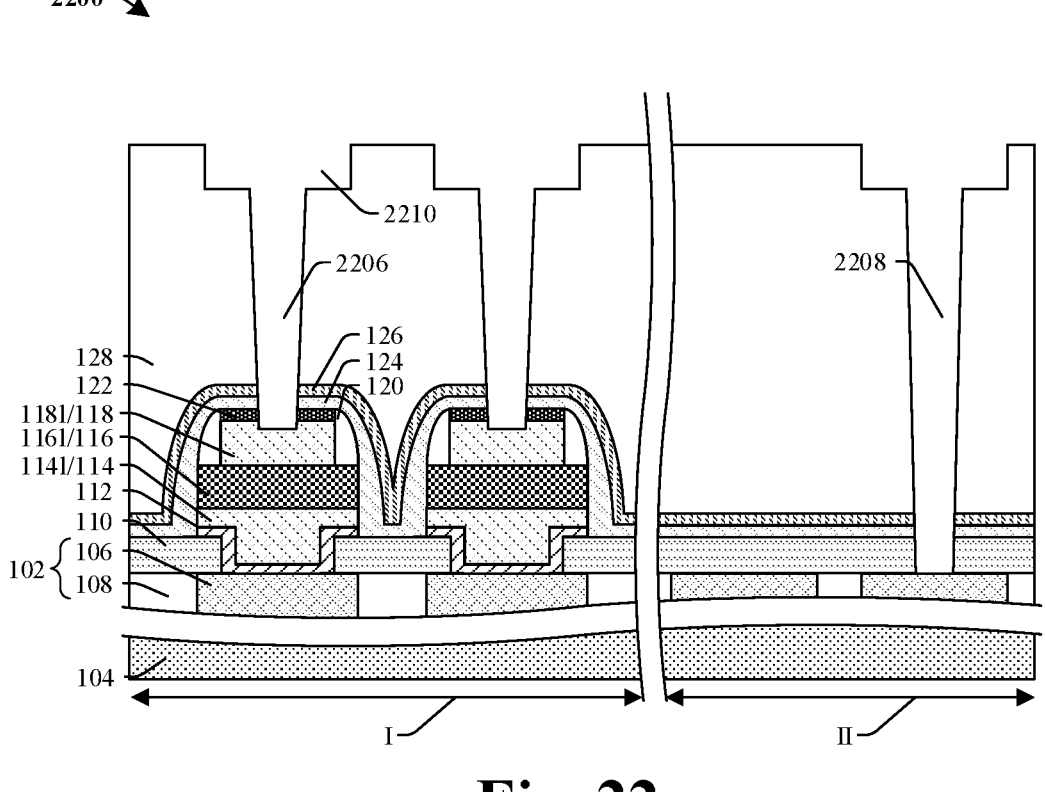

As shown in the cross-sectional view 2200 of FIG. 22, a first and second plurality of via openings 2206, 2208 are formed in the second dielectric layer 128. In some embodiments, the first and second plurality of via openings 2206, 2208 extend through the second dielectric layer 128 and the second etch stop layer 124. In some embodiments, the first region I has a first plurality of via openings 2206 that extend to a first depth within the second dielectric layer 128 and the second region II has a second plurality of via openings 2208 that extend to a second depth within the second dielectric layer 128. In further embodiments, the second depth is greater than the first depth. The first plurality of via openings 2206 extend into the top electrode 118. In some embodiments, the first and second plurality of via openings 2206, 2208 are formed using one or more etching steps and one or more masking steps. In some embodiments, a planarization process may be performed on the second dielectric layer 128 before or after the one or more etching steps and the one or more masking steps are performed.

Also shown in FIG. 22 are wire openings 2210 in the second dielectric layer 128. The wire openings 2210 overly the first and second plurality of via openings 2206, 2208. The wire openings 2210 are formed using one or more etching steps and one or more masking steps.

Figure 23:
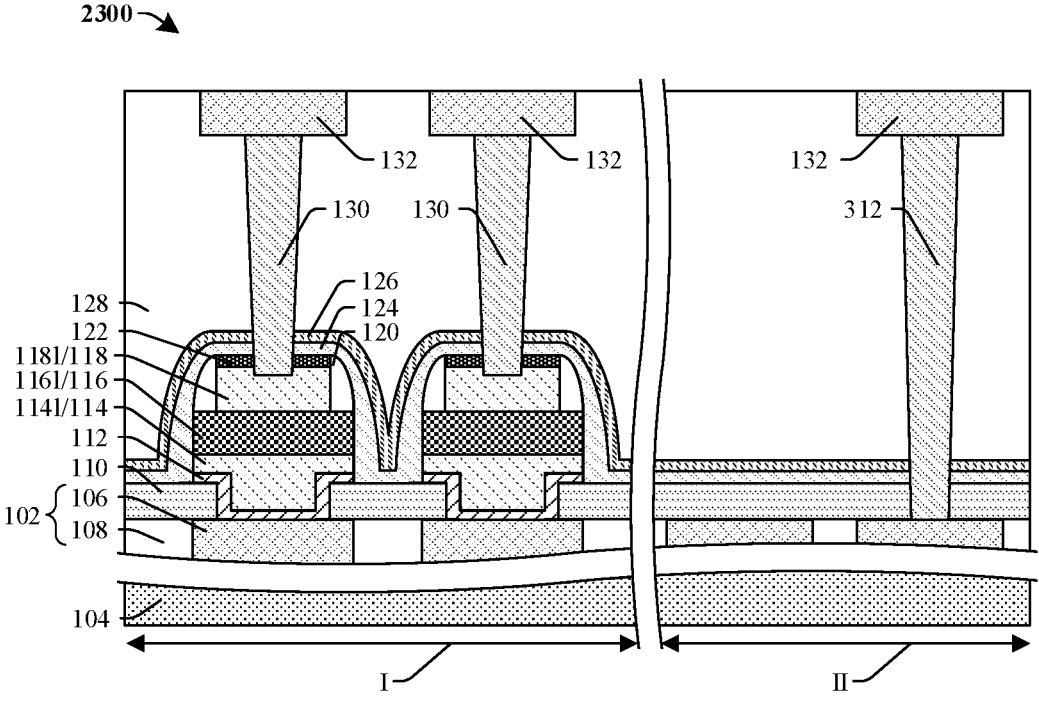

As shown in the cross-sectional view 2300 of FIG. 23, the top via 130, extended vias 312, and the upper wires 132 are formed within the second dielectric layer 128. The top via 130, extended vias 312, and the upper wires 132 are formed by filling the first and second plurality of via openings 2206, 2208 and the wire openings 2210 with a conductive material. The filling of the first and second plurality of via openings 2206, 2208 and the wire openings 2210 may be completed using CVD, PVD, ALD, the like, or any combination of the foregoing. A planarization process is then performed to remove portions of the conductive material above the top surface of the second dielectric layer 128. In some embodiments, the second dielectric layer 128 is not planarized until after the upper wires 132 is formed. The top via 130 extend from an elevation level with the upper wires 132 to an elevation level with a top surface of the top electrode 118.

FIG. 24 illustrates a flow diagram 2400 of some embodiments of a method for forming an integrated chip comprising a memory cell with a bottom via and a bottom electrode integrated into a first conductive layer.

While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2402, a first wire level is formed over a substrate. See, for example, FIG. 5.

At 2404, an etch stop layer is deposited over the first wire level. See, for example, FIG. 6.

At 2406, the etch stop layer is etched to form an opening over the first wire level. See, for example, FIG. 7.

At 2408, a barrier layer is deposited over the etch stop layer, the barrier layer extending into the opening. See, for example, FIG. 8.

At 2410, a first conductive layer is deposited over the barrier layer and in the opening. See, for example, FIG. 9.

As 2412, a planarization is performed into the first conductive layer, flattening a top of the first conductive layer, wherein the planarization stops before reaching the barrier layer. See, for example, FIG. 10.

As 2414, a data storage layer and a second conductive layer are deposited over the first conductive layer. See, for example, FIGS. 11-12.

At 2416, the barrier layer, the first conductive layer, the data storage layer, and the second conductive layer are patterned to form a memory cell at the opening. See, for example, FIGS. 14-18.

Therefore, the present disclosure relates to a method of forming an integrated chip comprising a memory cell with a bottom via and a bottom electrode integrated into a first conductive layer.

Some embodiments relate to a method of forming an integrated chip, including forming a first wire level over a substrate; depositing an etch stop layer over the first wire level; etching the etch stop layer to form an opening over the first wire level; depositing a barrier layer over the etch stop layer, the barrier layer extending into the opening; depositing a first conductive layer over the barrier layer and in the opening; performing a planarization into the first conductive layer to flatten a top of the first conductive layer, wherein the planarization stops before reaching the barrier layer; depositing a data storage layer and a second conductive layer over the first conductive layer; and patterning the barrier layer, the first conductive layer, the data storage layer, and the second conductive layer to form a memory cell at the opening.

In other embodiments, the present disclosure relates to a method of forming an integrated chip, including depositing an etch stop layer over a first region and a second region of the integrated chip; performing an etching process to define an opening in the etch stop layer in the first region; depositing a barrier layer over the etch stop layer and extending into the opening; depositing a first conductive layer over the etch stop layer, the first conductive layer having a protrusion demarcated by the opening in the etch stop layer and having a substantially constant first width; depositing a ferroelectric film over the first conductive layer; depositing a second conductive layer over the ferroelectric film; and patterning the first conductive layer, the ferroelectric film, the second conductive layer, and the barrier layer, the patterning defining a pad of the first conductive layer directly over the protrusion and the etch stop layer, the pad having a substantially constant second width greater than the first width and equal to a width of the patterned barrier layer.

In yet other embodiments, the present disclosure relates to an integrated chip, including a first wire level over a substrate; an etch stop layer overlying the first wire level; a conductive structure electrically coupled to the first wire level, wherein the conductive structure extends through the etch stop layer and overlies a top surface of the etch stop layer; a data storage layer overlying the conductive structure; a top electrode overlying the data storage layer, where the conductive structure, the data storage layer, and the top electrode define a memory cell; and a barrier layer separating the conductive structure from the etch stop layer, including from the top surface of the etch stop layer, and further separating the conductive structure from the first wire level.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with another figure, and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, comprising:
   forming a first wire level over a substrate;
   depositing an etch stop layer over the first wire level;
   etching the etch stop layer to form an opening over the first wire level;
   depositing a barrier layer over the etch stop layer, the barrier layer extending into the opening;
   depositing a first conductive layer over the barrier layer and in the opening;
   performing a planarization into the first conductive layer to flatten a top of the first conductive layer, wherein the planarization stops before reaching the barrier layer;
   depositing a data storage layer and a second conductive layer over the first conductive layer; and
   patterning the barrier layer, the first conductive layer, the data storage layer, and the second conductive layer to form a memory cell at the opening.

2. The method of claim 1, wherein patterning the first conductive layer, the data storage layer, and the second conductive layer comprises:
   patterning the second conductive layer into a top electrode using a first etching process;
   forming a spacer surrounding the top electrode; and
   patterning the data storage layer and the first conductive layer into a data storage structure and a conductive structure using a second etching process.

3. The method of claim 2, wherein the data storage structure, the conductive structure, and the barrier layer form a common sidewall extending from the etch stop layer to a top surface of the data storage structure.

4. The method of claim 2, wherein the conductive structure has a first width and the top electrode has a second width that is less than the first width.

5. The method of claim 2, further comprising:
   depositing a dielectric layer surrounding the memory cell; and
   forming a first via extending through the dielectric layer, from over the memory cell to the top electrode.

6. The method of claim 5, further comprising:
   forming a second via extending from an elevation level with a top of the first via to an elevation level with a top of the first wire level; and
   forming a second wire level electrically coupled to the first via and the second via.

7. The method of claim 2, wherein a first portion of the first conductive layer is demarcated by the opening in the etch stop layer, the first portion being configured to function as a bottom via, and wherein the patterning of the first conductive layer into the conductive structure defines a bottom electrode in a second portion of the conductive structure overlying the first portion.

8. A method of forming an integrated chip, comprising:
   depositing an etch stop layer over a first region and a second region of a substrate;
   performing an etching process to define an opening in the etch stop layer in the first region;
   depositing a barrier layer over the etch stop layer and extending into the opening;
   depositing a first conductive layer over the etch stop layer, the first conductive layer having a protrusion demarcated by the opening in the etch stop layer with a first width;

depositing a ferroelectric film over the first conductive layer;

depositing a second conductive layer over the ferroelectric film; and patterning the first conductive layer, the ferroelectric film, the second conductive layer, and the barrier layer, the patterning defining a patterned barrier layer and a pad of the first conductive layer directly over the protrusion and the etch stop layer, the pad having a second width greater than the first width and substantially equal to a width of the patterned barrier layer.

9. The method of claim 8, wherein the deposition of the first conductive layer is performed using a first deposition step, and wherein the protrusion and the pad of the first conductive layer are deposited during the first deposition step.

10. The method of claim 8, further comprising performing a planarization process, resulting in the first conductive layer having a planarized surface extending directly over the protrusion and the etch stop layer.

11. The method of claim 10, wherein after patterning the first conductive layer, the pad extends from a first edge of the planarized surface to a second edge of the planarized surface opposite the first edge, and the first and second edges are spaced from and on opposite sides of the opening.

12. The method of claim 8, wherein the pad and the protrusion of the first conductive layer form a "T" shape when viewed from a cross-sectional view, and wherein the barrier layer extends along bottom surfaces of the "T" shape.

13. The method of claim 8, wherein patterning the first conductive layer, the ferroelectric film, the second conductive layer, and the barrier layer further comprises:

patterning the second conductive layer using a first etching process;

patterning the first conductive layer using a second etching process different from the first etching process; and patterning the ferroelectric film during the same etching process as the patterning of the first conductive layer.

14. The method of claim 13, wherein patterning the first conductive layer, the ferroelectric film, and the second conductive layer forms a plurality of ferroelectric tunnel junction cells that are confined to the first region.

15. A method of forming an integrated chip, comprising:

patterning an etch stop layer over a substrate to form an opening extending through the etch stop layer;

depositing a barrier layer over the etch stop layer, the barrier layer lining sidewalls of the etch stop layer surrounding the opening;

depositing a first conductive layer over the barrier layer, filling the opening;

depositing a data storage layer and a second conductive layer over the first conductive layer; and patterning the second conductive layer into a top electrode;

forming a spacer surrounding sidewalls of the top electrode;

patterning the data storage layer, the first conductive layer, and the barrier layer to form a memory cell; and forming a second etch stop layer extending over the memory cell, the second etch stop layer covering sidewalls of remaining portions of the data storage layer and the first conductive layer; and forming a second barrier layer over the second etch stop layer, wherein the second barrier layer comprises a different material from the second etch stop layer and is separated from the memory cell by the second etch stop layer.

16. The method of claim 15, further comprising forming a first wire over the substrate before patterning the etch stop layer, wherein the opening formed by patterning the etch stop layer exposes the first wire.

17. The method of claim 15, wherein the barrier layer comprises a conductive material and extends from a bottom of the sidewalls of the etch stop layer to over an upper surface of the etch stop layer.

18. The method of claim 15, wherein the first conductive layer extends across an upper surface of the etch stop layer, and wherein the barrier layer separates the first conductive layer from the etch stop layer.

19. The method of claim 15, further comprising:

forming a masking layer over the top electrode before patterning the data storage layer, the first conductive layer, and the barrier layer; and removing the masking layer after the data storage layer, the first conductive layer, and the barrier layer are patterned.

20. The method of claim 15, wherein the first conductive layer has an upper surface spaced from a top surface of the barrier layer in a vertical direction.

* * * * *